(12) United States Patent
Ishii

(10) Patent No.: US 9,344,654 B2
(45) Date of Patent: May 17, 2016

(54) SOLID-STATE IMAGING DEVICE

(71) Applicant: Panasonic Intellectual Property Management Co., Ltd., Osaka (JP)

(72) Inventor: Motonori Ishii, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/613,122

(22) Filed: Feb. 3, 2015

(65) Prior Publication Data

US 2015/0146061 A1     May 28, 2015

Related U.S. Application Data

(63) Continuation of application No. PCT/JP2013/002469, filed on Apr. 11, 2013.

(30) Foreign Application Priority Data

Aug. 9, 2012  (JP) .................................. 2012-177342

(51) Int. Cl.
*H04N 3/14*  (2006.01)
*H04N 5/335*  (2011.01)
(Continued)

(52) U.S. Cl.
CPC ........ *H04N 5/3698* (2013.01); *H01L 27/14609* (2013.01); *H01L 27/307* (2013.01); *H04N 5/2254* (2013.01); *H04N 5/378* (2013.01); *H04N 5/3765* (2013.01)

(58) Field of Classification Search
CPC ... H04N 5/3698; H04N 5/378; H04N 5/3765; H04N 5/2254; H01L 27/307; H01L 27/14609
See application file for complete search history.

(56) References Cited

U.S. PATENT DOCUMENTS 4,363,963 A     12/1982 Ando
6,493,030 B1    12/2002 Kozlowski et al.
(Continued)

FOREIGN PATENT DOCUMENTS

JP     55-120182 A     9/1980
JP    2002-510944 A    4/2002
(Continued)

OTHER PUBLICATIONS

International Search Report issued in PCT/JP2013/002469, dated May 14, 2013, with English translation.

*Primary Examiner* — Twyler Haskins
*Assistant Examiner* — Carramah J Quiett
(74) *Attorney, Agent, or Firm* — McDermott Will & Emery LLP

(57) ABSTRACT

A solid-state imaging device includes pixels each including: a charge storage portion; an amplifier transistor having a gate connected to the charge storage portion; a selection transistor having a source connected to a source of the amplifier transistor and a drain connected to a column signal line; and a reset transistor having a source connected to the charge storage portion and a drain connected to the column signal line, and further includes a control unit which applies to a gate of the selection transistor a first voltage to place the selection transistor in a conductive state and applies to a gate of the reset transistor a second voltage to place the reset transistor in a non-conductive state in a pixel signal readout period, and applies to the gate of the selection transistor a voltage intermediate between the first voltage and the second voltage in a charge storage portion resetting period.

11 Claims, 14 Drawing Sheets

(51) Int. Cl.
  *H01L 27/148* (2006.01)
  *H04N 5/369* (2011.01)
  *H04N 5/378* (2011.01)
  *H01L 27/146* (2006.01)
  *H01L 27/30* (2006.01)
  *H04N 5/225* (2006.01)
  *H04N 5/376* (2011.01)

(56) References Cited

U.S. PATENT DOCUMENTS

| | | |
|---|---|---|
| 6,777,660 B1 | 8/2004 | Lee |
| 7,728,890 B2 | 6/2010 | Suzuki |
| 8,232,616 B2 | 7/2012 | Maehara et al. |
| 8,378,397 B2 | 2/2013 | Nakatani et al. |
| 8,704,281 B2 | 4/2014 | Maehara et al. |
| 8,803,211 B2 | 8/2014 | Nakatani et al. |
| 2005/0068438 A1 | 3/2005 | Kozlowski |
| 2006/0092299 A1 | 5/2006 | Suzuki |
| 2011/0049591 A1 | 3/2011 | Nakatani et al. |
| 2011/0049661 A1 | 3/2011 | Maehara et al. |
| 2012/0161270 A1 | 6/2012 | Maehara et al. |
| 2012/0305926 A1 | 12/2012 | Nakatani et al. |
| 2013/0107095 A1 | 5/2013 | Yarino et al. |

FOREIGN PATENT DOCUMENTS

| | | |
|---|---|---|
| JP | 2005-244355 A | 9/2005 |
| JP | 2006-120921 A | 5/2006 |
| JP | 2007-508740 A | 4/2007 |
| JP | 2011-071481 A | 4/2011 |
| JP | 2012-019168 A | 1/2012 |
| JP | 2012-019169 A | 1/2012 |
| WO | 99-52273 A1 | 10/1999 |
| WO | 2005-034339 A2 | 4/2005 |

US 9,344,654 B2

SOLID-STATE IMAGING DEVICE

CROSS REFERENCE TO RELATED APPLICATIONS

This is a continuation application of PCT International Application No. PCT/JP2013/002469 filed on Apr. 11, 2013, designating the United States of America, which is based on and claims priority of Japanese Patent Application No. 2012-177342 filed on Aug. 9, 2012. The entire disclosures of the above-identified applications, including the specifications, drawings and claims are incorporated herein by reference in their entirety.

FIELD

The present invention relates to a solid-state imaging device, in particular, to a stacked solid-state imaging device.

BACKGROUND

Patent Literature (PTL) 1 discloses a stacked solid-state imaging device. The stacked solid-state imaging device disclosed in PTL 1 generates noise in resetting signal charge. Specifically, if the shape of a reset pulse in pulse-off time is steep, whether the charge on a channel is transferred to a source or a drain of a reset transistor is determined at random. Thus, the transferred charge appears as kTC noise. The kTC noise is also generated by capacitive coupling between a reset signal line and a pixel electrode, for example.

Moreover, the stacked solid-state imaging device cannot completely cancel the kTC noise, even with use of correlated double sampling. This is because complete transfer of electrical charge is not allowed due to a fact that a photoelectric conversion unit above a semiconductor substrate and the semiconductor substrate are connected by a conducting material such as a metal. After signal charge is reset, the subsequent signal charge is added thereto while the kTC noise remains. Thus, signal charge having the kTC noise superimposed thereon is read out. The solid-state imaging device disclosed in PTL 1, therefore, has a problem of an increased kTC noise.

A technique as disclosed in PTL 2 is proposed to reduce the kTC noise.

FIG. 14 is a diagram showing a unit pixel disclosed in PTL 2 and its peripheral circuit. In the solid-state imaging device shown in PTL 2, a reset of signal charge generated by photodiodes 512 is initiated by completely turning on row selection transistors 518 of unit pixels 510 in a selected row. Here, one terminal of each of amplifier transistors 514 included in all the unit pixels 510 in the selected row is connected to a low impedance voltage source within a source power 530 via a column signal line 524. A transistor 520 connected to a power line 522 is biased as a current source by a waveform Vbias of a gate 526. The amplifier transistor 514 and the transistor 520 constitute an amplifier having negative gain. The channel resistance of a reset transistor 516 varies depending on a step-down reset power 550. Specifically, application of a reset pulse that has a ramp waveform generated from the step-down reset power 550 to a gate of the reset transistor 516 gradually increases the channel resistance of the reset transistor 516. Bandwidth of the kTC noise generated in the reset transistor 516 is inversely proportional to the channel resistance of the reset transistor 516, reducing the bandwidth of the kTC noise as the channel resistance increases. Thus, if the bandwidth of the kTC noise is reduced to a bandwidth of the amplifier configured of the amplifier transistor 514 and the transistor 520, the kTC noise is effectively suppressed due to negative feedback from the amplifier.

CITATION LIST

Patent Literature

[PTL 1] Japanese Unexamined Patent Application Publication No. S55-120182

[PTL 2] Japanese Unexamined Patent Application Publication No. 2002-510944

SUMMARY

Technical Problem

The technique disclosed in PTL 2 is applicable to unit pixels 510 each including four transistors: the amplifier transistor 514; the reset transistor 516; the row selection transistor 518; and the transistor 520, as shown in FIG. 14. In recent years, however, there has been demand for further size reduction of a solid-state imaging device, and thus a technique is desired which also reduces the kTC noise even if the unit pixel includes three transistors.

In view of the above problems, an object of the present invention is to provide a solid-state imaging device which can reduce the kTC noise even if a unit pixel includes three transistors.

Solution to Problem

To address the above problems, a solid-state imaging device according to the present invention is a solid-state imaging device including: a semiconductor substrate; a pixel portion which includes pixels in rows and columns above the semiconductor substrate; and a plurality of column signal lines provided for each of the columns of the pixel portion, the pixels each including: a photoelectric converting film; a pixel electrode disposed along a surface of the photoelectric converting film, the surface facing the semiconductor substrate; a transparent electrode disposed along a surface of the photoelectric converting film opposite the surface along which the pixel electrode is disposed; a charge storage portion electrically connected to the pixel electrode, the charge storage portion storing signal charge from the photoelectric converting film; an amplifier transistor which outputs a pixel signal dependent on quantity of the signal charge in the charge storage portion; a reset transistor which resets electric potential of the charge storage portion; and a selection transistor which determines a timing at which the amplifier transistor is to output the pixel signal, the solid-state imaging device further including a control unit configured to apply to a gate terminal of the selection transistor a first voltage which places the selection transistor in a conductive state and apply to a gate terminal of the reset transistor a second voltage which places the reset transistor in a non-conductive state in a first time period where the pixel signal dependent on the quantity of the signal charge in the photoelectric converting film is read out, and apply to the gate terminal of the selection transistor a third voltage which is an intermediate value between the first voltage and the second voltage in a second time period where the charge storage portion is reset.

Advantageous Effects

According to the solid-state imaging device of the present invention, the kTC noise is reduced even if a unit pixel includes three transistors.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Hereinafter, a solid-state imaging device according to embodiments of the present invention and a method for driving the same will be described, with reference to the accompanying drawings. It should be noted that the solid-state imaging device according to the present invention will be described with reference to the following embodiments and the accompanying drawings for illustration purposes only. The present invention is not limited to the embodiments and the drawings.

Embodiment 1

An overall configuration of a solid-state imaging device according to an embodiment 1 will be described.

Figure 1:
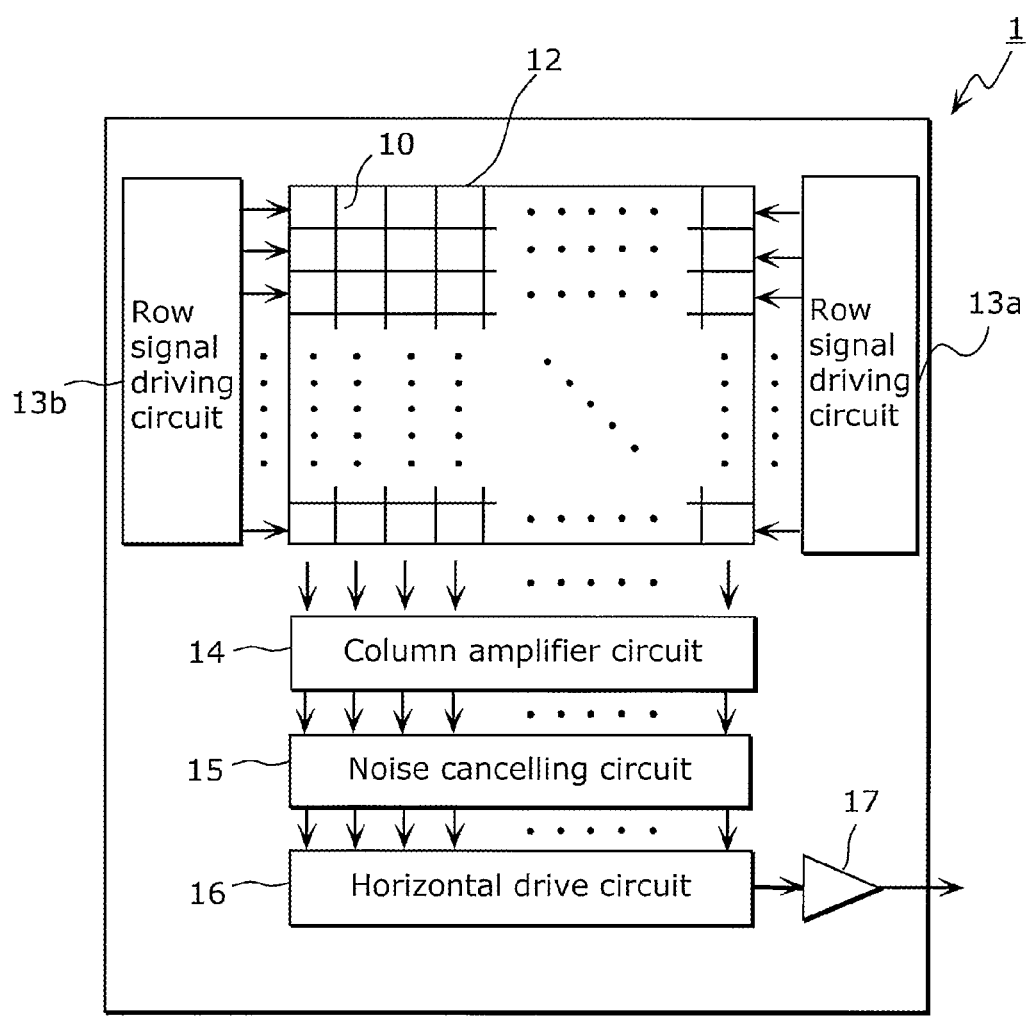
FIG. 1 is a block diagram showing an overall configuration of a solid-state imaging device according to embodiments of the present invention.

FIG. 1 is a block diagram showing an overall configuration of a solid-state imaging device according to embodiments of the present invention. A solid-state imaging device 1 depicted in the figure includes a pixel portion 12 in which a plurality of pixels 10 are arranged in rows and columns, row signal driving circuits 13a and 13b, a column amplifier circuit 14 configured of amplifier circuits each disposed on each column, a noise cancelling circuit 15 configured of, for example, correlated double sampling (CDS) circuits each disposed on each column, a horizontal drive circuit 16, and an output stage amplifier 17.

Figure 2:
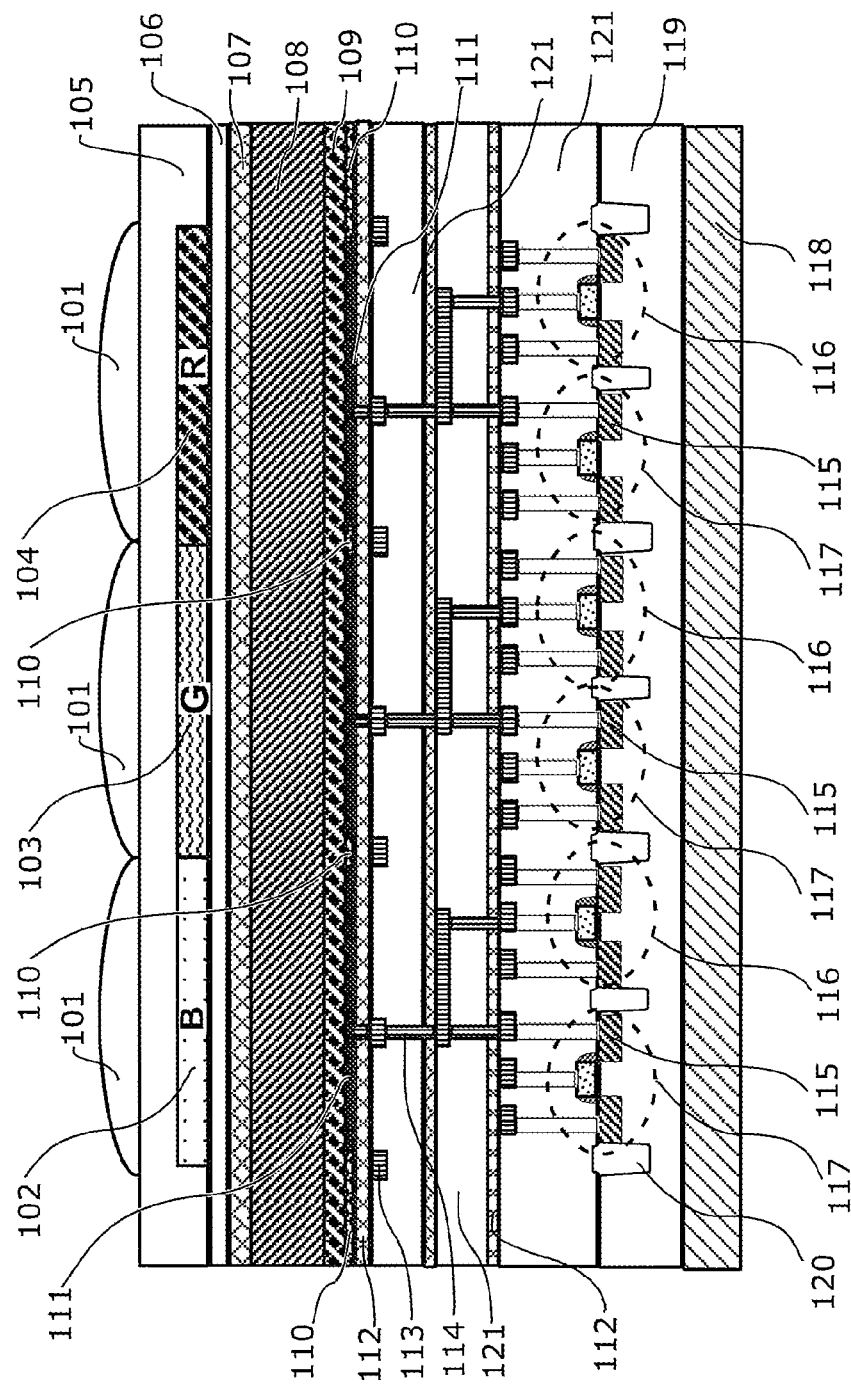
FIG. 2 is a cross-sectional view of three pixels of the solid-state imaging device according to the embodiments.

FIG. 2 is a cross-sectional view of three pixels of the solid-state imaging device according to the embodiments. It should be noted that in an actual solid-state imaging device, the pixel portion 12 includes, for example, ten million pixels arranged in rows and columns. As shown in FIG. 2, the solid-state imaging device 1 includes microlenses 101, red color filters 104, green color filters 103, blue color filters 102, a protective film 105, a planarizing film 106, an upper electrode 107, a photoelectric converting film 108, an electron blocking layer 109, an inter-electrode insulating film 110, lower electrodes 111, an inter-line insulating film 112, a power feed layer 113, a line layer 114, a substrate 118, a well 119, shallow trench isolation regions (STI) 120, and an inter-layer insulating layer 121.

The substrate 118 is a semiconductor substrate, for example, a silicon substrate. The substrate 118 includes the P-type well 119 formed therein. The well 119 includes the STI regions 120 formed therein, which electrically isolate elements one from another. The STI region 120 may comprise $SiO_2$ or may be an isolation region doped with highly-concentrated P-type impurities. Within the well 119, an FD (charge storage) portion 115, an amplifier transistor 116, a reset transistor 117, and a selection transistor (not shown) are disposed as a signal readout circuit in each pixel. While the well 119 has a conductivity type of P type, it should be noted that the conductivity type may be N type.

The microlens 101 is disposed on the top surface of the solid-state imaging device 1 for each pixel 10, to efficiently collect incident light.

The red color filter 104, the green color filter 103, and the blue color filter 102 are provided to image a color image. The red color filter 104, the green color filter 103, and the blue color filter 102 are disposed immediately below each microlens 101 and within the protective film 105. These optical elements are disposed above the planarizing film 106 to form a group of color filters and the microlens 101 which cause no irregular light collection and no irregular color across the ten million pixels. The planarizing film 106 comprises SiN, for example.

The upper electrode 107 is disposed across the pixel portion 12. The upper electrode 107 is disposed below the planarizing film 106 and along a surface of the photoelectric converting film 108, the surface being away from the lower electrodes 111. The upper electrode 107 is a transparent electrode which passes visible light therethrough. The upper electrode 107 comprises indium tin oxide (ITO), for example.

The photoelectric converting film 108 converts light into signal charge. Specifically, the photoelectric converting film 108, comprising organic molecules having high light-absorbing capacity, is disposed below the upper electrode 107. The photoelectric converting film 108 has a thickness of about 500 nm, for example. The photoelectric converting film 108 is formed by a vacuum deposition method, for example. The organic molecules have the high light-absorbing capacity across visible light that has a wavelength of about 400 nm to about 700 nm.

The electron blocking layer 109 is disposed below the photoelectric converting film 108. The electron blocking layer 109 conducts holes therethrough which are generated by performing photoelectric conversion on the incident light, and blocks electron injection from the lower electrode 111.

The electron blocking layer 109 is disposed above the inter-electrode insulating film 110 having high flatness, and the lower electrodes 111. The electron blocking layer 109 comprises an organic material, for example.

The plurality of lower electrodes 111 are pixel electrodes arranged in rows and columns above the substrate 118, and disposed along a surface of the photoelectric converting film 108, the surface facing the substrate 118. The plurality of lower electrodes 111 are electrically isolated 0.2 μm apart one from another. Specifically, the lower electrodes 111 are disposed in the inter-electrode insulating film 110, and collect the holes generated in the photoelectric converting film 108. The lower electrode 111 comprises TiN, for example. Moreover, the lower electrodes 111 are disposed above the inter-line insulating film 112 which is planarized and has a thickness of about 100 nm.

The power feed layer 113 is disposed below the inter-electrode insulating film 110 and underneath the inter-line insulating film 112. The power feed layer 113 comprises Cu, for example. Specifically, the power feed layer 113 is disposed between adjacent ones of the lower electrodes 111 and between the substrate 118 and the lower electrodes 111. Electric potential independent of the lower electrodes 111 can be fed to the power feed layer 113. Specifically, electric potential for excluding the signal charges is fed to the power feed layer 113 in pixel exposure where the photoelectric converting film 108 performs the photoelectric conversion, and in signal readout where the signal readout circuit generates a pixel signal dependent on the signal charge quantity. For example, if the signal charges are holes, a positive voltage is applied to the power feed layer 113. This configuration can prevent contamination of the holes into each pixel from an adjacent pixel. The application of a voltage to the power feed layer 113 is controlled by, for example, a control unit (not shown) included in the solid-state imaging device 1.

The line layer 114 is connected to the power feed layer 113. The line layer 114 is connected to the FD portion 115 of the signal readout circuit and a gate terminal of each amplifier transistor 116. The FD portion 115 is electrically connected to the lower electrode 111. The FD portion 115 is a charge storage portion where the signal charge from the photoelectric converting film 108 is stored. Furthermore, the FD portion 115 doubles as either a source or a drain of the reset transistor 117. The signal readout circuits disposed in the well 119 detect changes in current or voltage generated on the plurality of lower electrodes 111 to generate pixel signals dependent on the signal charge quantity. Specifically, the amplifier transistor 116 amplifies the change in current or voltage generated on the lower electrode 111 to generate a pixel signal dependent on the signal charge quantity.

The reset transistor 117 has a gate terminal connected to a reset transistor control line, and is turned on and off under control by electric potential of the reset transistor control line. For example, if the electric potential of the reset transistor control line is high, the reset transistor 117 is turned on. If the electric potential of the reset transistor control line is low, the reset transistor 117 is turned off. The selection transistor has a gate terminal connected to a selection transistor control line, and is turned on and off under control by electric potential of the selection transistor control line. For example, if the electric potential of the selection transistor control line is high, the selection transistor is turned on. If the electric potential of the selection transistor control line is low, the selection transistor is turned off.

Figure 3:
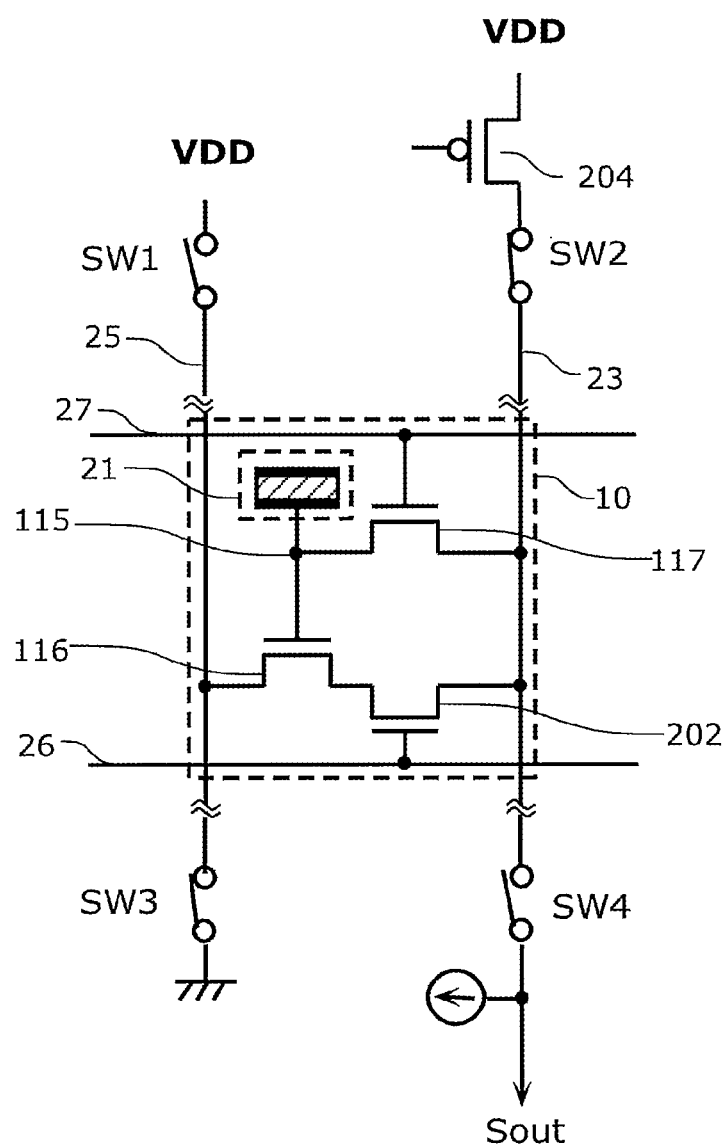
FIG. 3 is a circuit diagram of a pixel portion of a solid-state imaging device according to an embodiment 1.

FIG. 3 is a circuit diagram of the pixel portion of the solid-state imaging device according to the embodiment 1. Specifically, the figure illustrates an example of a circuit of the pixel 10 belonging to row m (m is a natural number) and column n (n is a natural number) of the pixel portion 12, and its peripheral circuit in the present embodiment. The pixel includes a photoelectric conversion unit 21, the FD portion 115, the amplifier transistor 116, a selection transistor 202, and the reset transistor 117. The FD portion 115, the amplifier transistor 116, the selection transistor 202, and the reset transistor 117 constitute a pixel circuit.

The photoelectric conversion unit 21 is configured of the photoelectric converting film 108, the lower electrode 111, and the upper electrode 107 shown in FIG. 2, and performs the photoelectric conversion on the incident light to generate signal charge dependent on the incident light quantity.

The selection transistor 202 has a source and a drain one of which is connected to one of a source and a drain of the amplifier transistor 116. The other of the source and the drain of the selection transistor 202 is connected to a column signal line 23 provided for each column of the pixel portion 12, and thus controls whether to transfer, to the column signal line 23, a signal detected by the amplifier transistor 116. In other words, the selection transistor 202 determines a timing when the amplifier transistor 116 outputs a pixel signal.

The other of the source and the drain of the amplifier transistor 116 is connected to a power potential feeding line 25 provided for each column of the pixel portion 12. The amplifier transistor 116 outputs a pixel signal dependent on signal charge quantity of the FD portion 115. One end of the power potential feeding line 25 is connected, via a switch SW1, to a power potential feeding circuit which is a source of high-level power potential VDD, for example. The other end of the power potential feeding line 25 is connected, via a switch SW3, a ground potential feeding circuit which is a source of ground potential. The power potential feeding line 25 is commonly connected to a plurality of the pixels 10 belonging to the column n.

The reset transistor 117 has a source and a drain one of which is connected to the column signal line 23. The other of the source and the drain of the reset transistor 117 is connected to the photoelectric conversion unit 21 and the gate terminal of the amplifier transistor 116. The reset transistor 117 resets electric potential of the FD portion 115.

One end of the column signal line 23 is connected to the power potential feeding circuit via a switch SW2 and a load transistor 204. A constant voltage is applied to a gate terminal of the load transistor 204. Thus, the power potential feeding circuit and the load transistor 204 act as a constant current source. The other end of the column signal line 23 is connected to the subsequent column amplifier circuit and so on via a switch SW4, and electric potential S23 of the column signal line 23 is thus output to the subsequent column amplifier via the switch SW4. The column signal line is commonly connected to the plurality of pixels 10 belonging to the column n.

A selection transistor control line 26 is connected to a gate terminal of the selection transistor 202. A reset transistor control line 27 is connected to the gate terminal of the reset transistor 117. The selection transistor control line 26 and the reset transistor control line 27 are provided for each row. The selection transistor control line 26 and the reset transistor control line 27 are commonly connected to a plurality of the pixels 10 belonging to the row m.

While the transistors included in each pixel 10 are NMOS transistors in the embodiment 1, it should be noted that the transistors are PMOS transistors if the conductivity type of the well 119 is N type.

Figure 4:
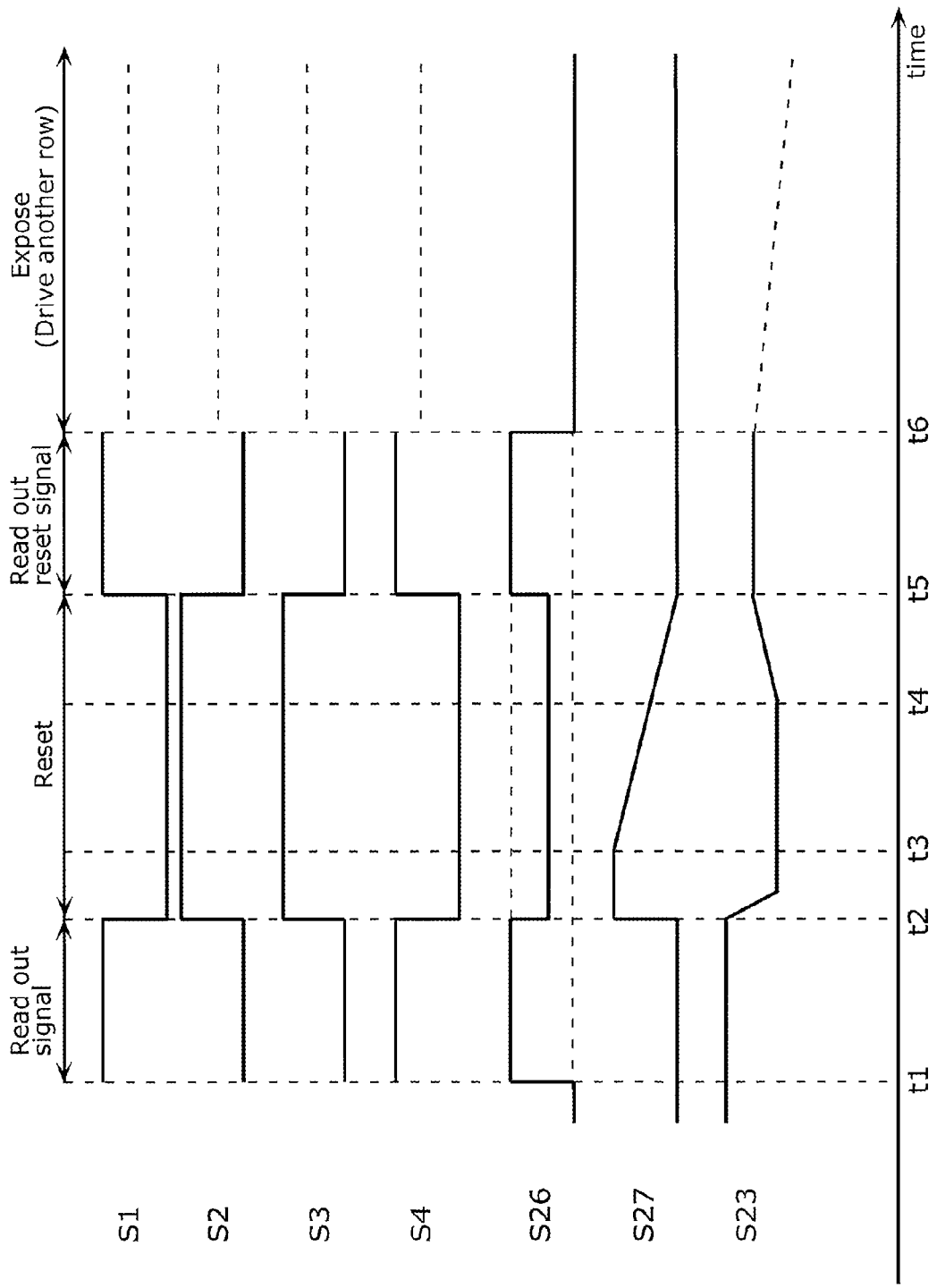
FIG. 4 is a timing diagram showing a method for driving the solid-state imaging device according to the embodiment 1.

FIG. 4 is a timing diagram showing a method for driving the solid-state imaging device according to the embodiment 1. Specifically, the figure is a timing diagram showing a method for driving the pixels in the row m, including the pixel 10 shown in FIG. 3, and its peripheral circuit. The solid-state imaging device 1 includes a control unit. For example, the row signal driving circuits 13a and 13b shown in FIG. 1 correspond to the control unit according to the present embodiment. The control unit applies a control signal 51 to the switch SW1, a control signal S2 to the switch SW2, a control signal S3 to the switch SW3, and a control signal S4 to the switch SW4. The switch turns on and is placed in a conductive state when the control signal is high. The switch turns off and is placed in a non-conductive state when the control signal is low.

Moreover, the control unit applies a control signal S26 to the gate terminal of the selection transistor 202 via the selection transistor control line 26. The control unit also applies a control signal S27 to the gate terminal of the reset transistor 117 via the reset transistor control line 27.

It should be noted that the application of the control signals S1 to S4 may not be controlled by the row signal driving circuits 13a and 13b, and may be controlled by another drive circuit included in the solid-state imaging device 1.

At a time t1, the pixel signal dependent on the quantity of signal charge generated by the photoelectric conversion unit 21 is output via the column signal line 23. The control signals S1 and S4 are high, and thus the switch SW1, which is a first switch, and the switch SW4 are conductive. At this time, the power potential VDD is fed to the power potential feeding line 25. Meanwhile, the control signals S2 and S3 are low, and thus the switch SW2 and the switch SW3, which is a second switch, are non-conductive. Moreover, the control signal S26 is high, and thus the selection transistor 202 is conductive. The control signal S27 is low, and thus the reset transistor 117 is non-conductive.

At this time, the electric potential S23 of the column signal line 23 represents the pixel signal dependent on the quantity of the signal charge generated by the photoelectric conversion unit 21.

At a time t2, a reset of the FD portion 115 is initiated. At this time, all the control signals S1, S2, S3, and S4 are inverted. Specifically, the control signals S1 and S4 change to low, and thus placing the switch SW1, which is the first switch, and the switch SW4 in the non-conductive state. The control signals S2 and S3 change to high, and thus placing the switch SW2 and the switch SW3, which is the second switch, in the conductive state. At this time, the ground potential is fed to the power potential feeding line 25. Meanwhile, the control signal S27 changes to high, and thus placing the reset transistor 117 in the conductive state. Moreover, the control signal S26 changes to have electric potential which is intermediate between high and low, and thus increasing the channel resistance of the selection transistor 202 as compared with when the control signal S26 is high. Due to this, the selection transistor 202 acts as a load on the amplifier transistor 116. As a result, the two transistors, the amplifier transistor 116 and the selection transistor 202, form what is known as a cascode amplifier. The cascode amplifier is known that it can boost gain greater than when an amplifier is formed of the amplifier transistor 116 only. Additionally, an input and an output of the cascode amplifier are shorted by the reset transistor 117. Hence, the electric potential S23 of the column signal line 23 is determined depending on the load transistor 204 and characteristics of the cascode amplifier having the shorted input and output.

At a time t3, the control signal S27 starts gradually dropping down from high. In other words, the control signal S27 is slowly and continuously changed so as to have tapering characteristics (monotonically decreasing characteristics). The bandwidth of the kTC noise generated in the reset transistor 117 is inversely proportional to the channel resistance of the reset transistor 117. Hence, the cascode amplifier formed of the two transistors, the amplifier transistor 116 and the selection transistor 202, accommodates the bandwidth of the kTC noise generated in the reset transistor 117, thereby achieving a high reduction in noise.

At a time t4, the electric potential S23 of the column signal line 23 starts rising. Specifically, after the reset transistor 117 turns off, the electric potential of the FD portion 115 falls to respond to the gate voltage of the reset transistor 117, due to coupling capacitance of the gate terminal of the reset transistor 117 and the FD portion 115. This is because the amplifier transistor 116 inverts, amplifies, and outputs the electric potential of the FD portion 115.

At a time t5, the reset of the FD portion 115 is completed. A reset signal dependent on the electric potential of the reset FD portion 115 is output via the column signal line 23. At this time, all the control signals S1, S2, S3, and S4 are inverted. Specifically, the control signals S1 and S4 change to high, and thus placing the switches SW1 and SW4 in the conductive state. The control signals S2 and S3 change to low, and thus placing the switches SW2 and SW3 in the non-conductive state. Moreover, the control signal S26 changes to high, and thus placing the selection transistor 202 in the conductive state. The control signal S27 reaches low, and thus placing the reset transistor 117 in the non-conductive state. At this time, the electric potential S23 of the column signal line 23 represents the reset signal depending on the electric potential of the reset FD portion 115.

At a time t6, the control signal S26 changes to low, which completes the readout of pixel signals dependent on the reset signals and the signal charge quantity, from the pixels in the row m, including the pixel 10. After the time t6, the signal charges generated by the photoelectric conversion unit 21 with respect to the pixels in the row m, including the pixel 10, are stored into the FD portion 115 to read out subsequent pixel signals dependent on signal charge quantity. In the meantime, the driving of pixels as described with respect to the times t1 to t6 is implemented on pixels in a row other than the row m, to read out pixel signals, which are dependent on reset signals and signal charge quantity, one after another from the pixels in the row other than the row m.

Specifically, in a first time period (the times t1 and t2) where the pixel signal dependent on the quantity of signal charge generated in the photoelectric converting film 108 is read out, a high level of first voltage is applied to the gate terminal of the selection transistor 202 to place the selection transistor 202 in the conductive state and a low level of second voltage is applied to the gate terminal of the reset transistor 117 to place the reset transistor 117 in the non-conductive state. In a second time period (the times t2 to t5) where the FD portion 115 is reset, a third voltage which is an intermediate value between the first voltage and the second voltage is applied to the gate terminal of the selection transistor 202.

Also, in the second time period, a voltage continuously changing from the first voltage to place the reset transistor 117 in the conductive state, to the second voltage to place the reset transistor 117 in the non-conductive state, is applied to the gate terminal of the reset transistor 117.

The other of the source and the drain of the amplifier transistor 116 is connected to the power potential feeding line 25. In the above-mentioned first time period, a high level of power voltage is fed to the power potential feeding line 25. In the above-mentioned second time period, a low level of ground voltage is fed to the power potential feeding line 25.

As described above, the solid-state imaging device according to the embodiment 1 applies electric potential which is intermediate between high and low to the gate terminal of the selection transistor 202 in resetting the FD portion 115. This causes gain in the selection transistor 202 as well. The gain occurred in the selection transistor 202 and the gain in the amplifier transistor 116 are combined, thereby increasing the gain across the pixel circuit. Thus, the kTC noise is more effectively reduced even if the unit pixel includes three transistors.

Embodiment 2

A solid-state imaging device according to an embodiment 2 and a method for driving the same will be described. It should be noted that the same reference signs as those used in the embodiment 1 will be used herein to refer to substantially the same components, and the description of the components may be omitted. The overall configuration and sectional view of the solid-state imaging device according to the embodiment 2 are substantially the same as those of the solid-state imaging device according to the embodiment 1, and thus will not be described.

Figure 5:
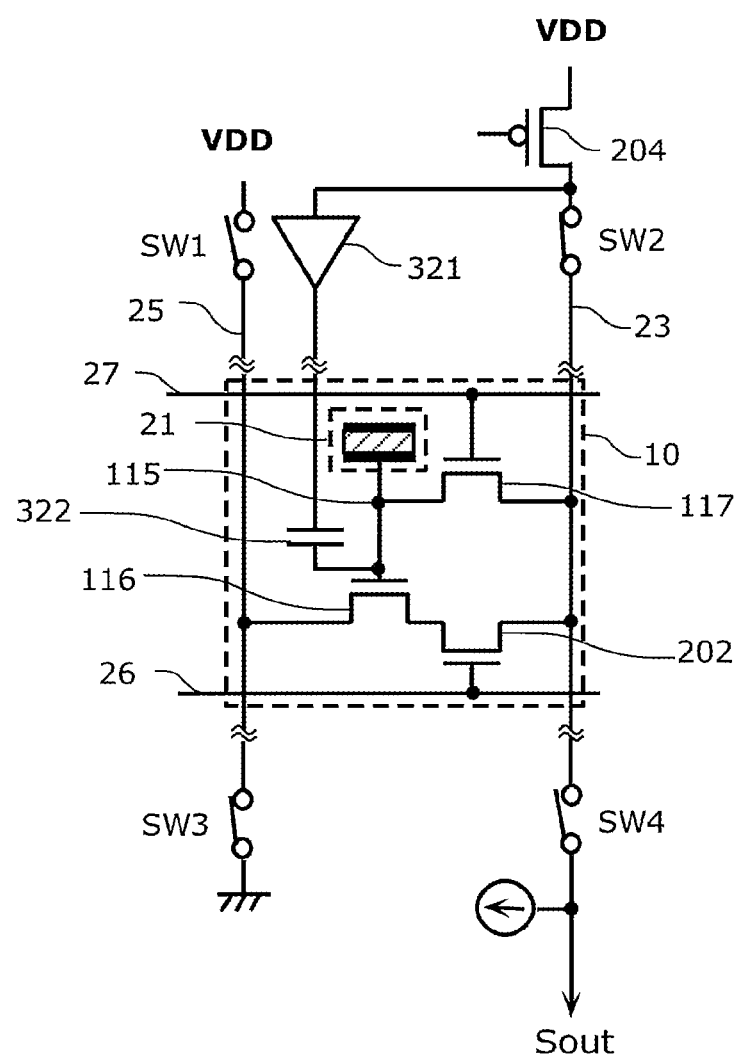
FIG. 5 is a circuit diagram of a pixel portion of a solid-state imaging device according to an embodiment 2.

FIG. 5 is a circuit diagram of a pixel portion of the solid-state imaging device according to the embodiment 2. Specifically, the figure illustrates an example of a circuit of a pixel 10 belonging to row m (m is a natural number) and column n (n is a natural number) of a pixel portion 12, and its peripheral circuit in the present embodiment. Description will be given, focusing on differences from the circuit of the pixel 10 and its peripheral circuit according to the embodiment 1.

A load transistor 204 has a source and a drain one of which is connected to a power potential feeding circuit which feeds power potential VDD. The other of the source and the drain of the load transistor 204 is connected to a column signal line 23 via a switch SW2. The other of the source and the drain of the load transistor 204 is also connected to an input terminal of an amplifier 321. An output terminal of the amplifier 321 is connected to an FD portion 115, and a gate terminal of an amplifier transistor 116 via a capacitor 322. This configuration allows amplification of the amplitude of a voltage applied between a source and a drain of a reset transistor 117, thereby further increasing the effect of reducing kTC noise.

While the transistors included in each pixel 10 are NMOS transistors in the embodiment 2, it should be noted that the transistors are PMOS transistors if the conductivity type of a well 119 is N type.

The timing diagram showing the method for driving pixels in the row m, including a pixel 10 shown in FIG. 5, and its peripheral circuit is substantially the same as the timing diagram according to the embodiment 1 shown in FIG. 4. A control unit causes two transistors, a selection transistor 202 and the amplifier transistor 116, to act as a cascode amplifier in times t2 to t5, to reduce kTC noise generated in the reset transistor 117.

As described above, in the solid-state imaging device according to the embodiment 2, electric potential which is intermediate between high and low is applied to a gate terminal of the selection transistor 202 in resetting the FD portion 115, thereby increasing the gain across the pixel circuit. Thus, the kTC noise is reduced even if the unit pixel includes three transistors. Furthermore, changing the electric potential of the FD portion 115 by the amplifier 321 brings an increased effect of reducing the kTC noise.

Embodiment 3

A solid-state imaging device according to an embodiment 3 and a method for driving the same will be described. It should be noted that the same reference signs as those used in the embodiment 1 will be used herein to refer to substantially the same components, and the description of the components may be omitted. The overall configuration and sectional view of the solid-state imaging device according to the embodiment 3 are substantially the same as those of the solid-state imaging device according to the embodiment 1, and thus will not be described.

Figure 6:
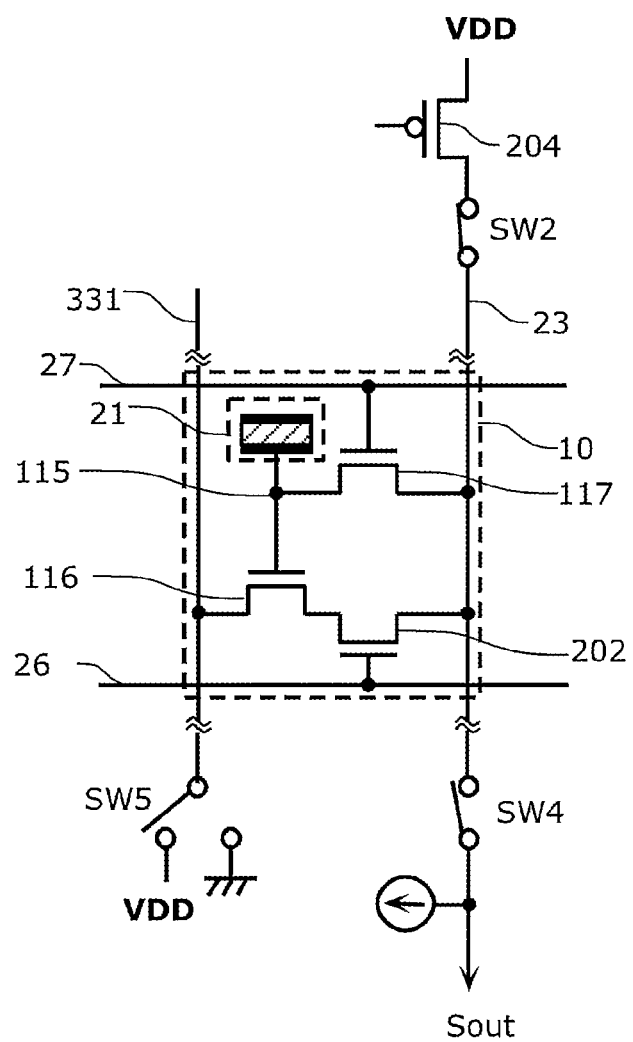
FIG. 6 is a circuit diagram of a pixel portion of a solid-state imaging device according to an embodiment 3.

FIG. 6 is a circuit diagram of a pixel portion of the solid-state imaging device according to the embodiment 3. Specifically, the figure illustrates an example of a circuit of a pixel 10 belonging to row m (m is a natural number) and column n (n is a natural number) of a pixel portion 12, and its peripheral circuit in the present embodiment. Description will be given, focusing on differences from the circuit of the pixel 10 and its peripheral circuit according to the embodiment 1.

A power/ground potential feeding line 331 is a power potential feeding line connected to sources or drains of amplifier transistors of a plurality of pixels belonging to the column n, including the pixel 10. One end of the power/ground potential feeding line 331 is selectively connected, via a switch SW5, to a power potential feeding circuit which feeds power potential VDD or a ground potential feeding circuit which feeds ground potential.

Figure 7:
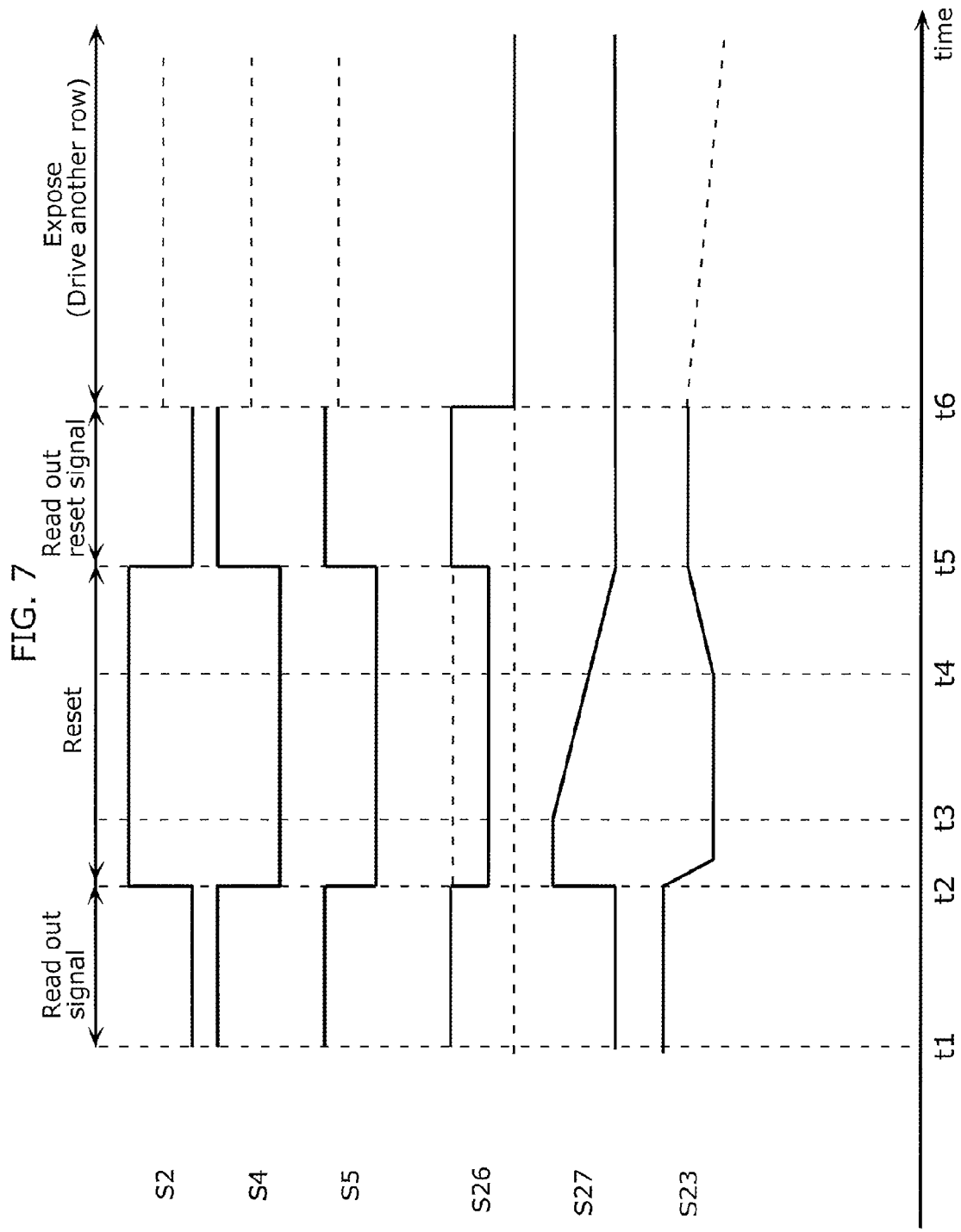
FIG. 7 is a timing diagram showing a method for driving the solid-state imaging device according to the embodiment 3.

FIG. 7 is a timing diagram showing a method for driving the solid-state imaging device according to the embodiment 3. Specifically, the figure is a timing diagram showing a method for driving pixels in the row m, including the pixel 10 shown in FIG. 6, and its peripheral circuit. A control signal S5 is applied to the switch SW5. When the control signal S5 is high, the one end of the power/ground potential feeding line 331 is connected to the power potential feeding circuit. When the control signal S5 is low, the one end of the power/ground potential feeding line 331 is connected to the ground potential feeding circuit.

At a time t1, a pixel signal dependent on the quantity of signal charge generated by the photoelectric conversion unit 21 is output via a column signal line 23. A control signal S4 is high, and thus a switch SW4 is conductive. A control signal S2 is low, and thus a switch SW2 is non-conductive. The control signal S5 is high, and thus the one end of the power/ground potential feeding line 331 is connected to the power potential feeding circuit. Meanwhile, a control signal S26 is high, and thus a selection transistor 202 is conductive. A control signal S27 is low, and thus a reset transistor 117 is non-conductive. At this time, electric potential S23 of the column signal line 23 represents the pixel signal dependent on the quantity of the signal charge generated by the photoelectric conversion unit 21.

At a time t2, a reset of the FD portion 115 is initiated. At this time, all the control signals S2, S4, and S5 are inverted. Specifically, the control signal S4 changes to low, and thus placing the switch SW4 in the non-conductive state. The control signal S2 changes to high, and thus placing the switch SW2 in the conductive state. The control signal S5 changes to low, and thus connecting the one of the power/ground potential feeding line 331 to the ground potential feeding circuit. The control signal S27 changes to high, and thus placing the reset transistor 117 in the conductive state. The control signal S26 changes to have electric potential which is intermediate between high and low, and thus the selection transistor 202 presents a load on an amplifier transistor 116, thereby two transistors, the amplifier transistor 116 and the selection transistor 202 forming what is known as a cascode amplifier. The cascode amplifier is known that it can boost gain greater than when an amplifier is formed of the amplifier transistor 116 only. Additionally, an input and an output of the cascode amplifier are shorted by the reset transistor 117. At this time, the electric potential S23 of the column signal line 23 is automatically determined depending on a load transistor 204 and characteristics of the cascode amplifier having the shorted input and output.

At a time t3, the control signal S27 starts gradually dropping down from high. In other words, the control signal S27 is slowly and continuously changed so as to have tapering characteristics (monotonically decreasing characteristics). The bandwidth of the kTC noise generated in the reset transistor 117 is inversely proportional to the channel resistance of the reset transistor 117. Hence, the cascode amplifier formed of the two transistors, the amplifier transistor 116 and the selection transistor 202, accommodates the bandwidth of the kTC noise generated in the reset transistor 117, thereby achieving a high reduction in noise.

At a time t4, the electric potential S23 of the column signal line 23 starts rising. Specifically, after the reset transistor 117 turns off, the electric potential of the FD portion 115 falls to respond to the gate voltage of the reset transistor 117, due to coupling capacitance of the gate terminal of the reset transistor 117 and the FD portion 115. This is because the amplifier transistor 116 inverts, amplifies, and outputs the electric potential of the FD portion 115.

At a time t5, the reset of the FD portion 115 is completed. A reset signal dependent on the electric potential of the reset FD portion 115 is output via the column signal line 23. At this time, all the control signals S2, S4, and S5 are inverted. Specifically, the control signal S4 changes to high, and thus placing the switch SW4 in the conductive state. The control signal S2 changes to low, and thus placing the switch SW2 in the non-conductive state. The control signal S5 changes to high, and thus connecting the one end of the power/ground potential feeding line 331 to the power potential feeding circuit. Moreover, the control signal S26 changes to high, and thus placing the selection transistor 202 in the conductive state. The control signal S27 changes to low, and thus placing the reset transistor 117 in the non-conductive state. At this time, the electric potential S23 of the column signal line 23 represents the reset signal dependent on the electric potential of the reset FD portion 115.

At a time t6, the control signal S26 changes to low, which completes the readout of pixel signals dependent on the reset signals and the signal charge quantity, from the pixels in the row m, including the pixel 10. After the time t6, the signal charges generated by the photoelectric conversion unit 21 with respect to the pixels in the row m, including the pixel 10, are stored into the FD portion 115 to read out subsequent pixel signals dependent on signal charge quantity. In the meantime, the driving of pixels as described in FIG. 3 is implemented on pixels in a row other than the row m, such as row (m+1), to read out pixel signals, which are dependent on reset signals and signal charge quantity, one after another from the pixels in the row other than the row m.

As described above, in the solid-state imaging device according to the embodiment 3, electric potential intermediate between high and low is applied to a gate terminal of the selection transistor 202 in resetting the FD portion 115, thereby increasing the gain across the pixel circuit. Thus, the kTC noise is reduced even if the unit pixel includes three transistors.

Embodiment 4

A solid-state imaging device according to an embodiment 4 and a method for driving the same will be described. It should be noted that the same reference signs as those used in the embodiment 1 or 3 will be used herein to refer to substantially the same components and the description of the components may be omitted. The overall configuration and sectional view of the solid-state imaging device according to the embodiment 4 are substantially the same as those of the solid-state imaging device according to the embodiment 1, and thus will be omitted.

Figure 8:
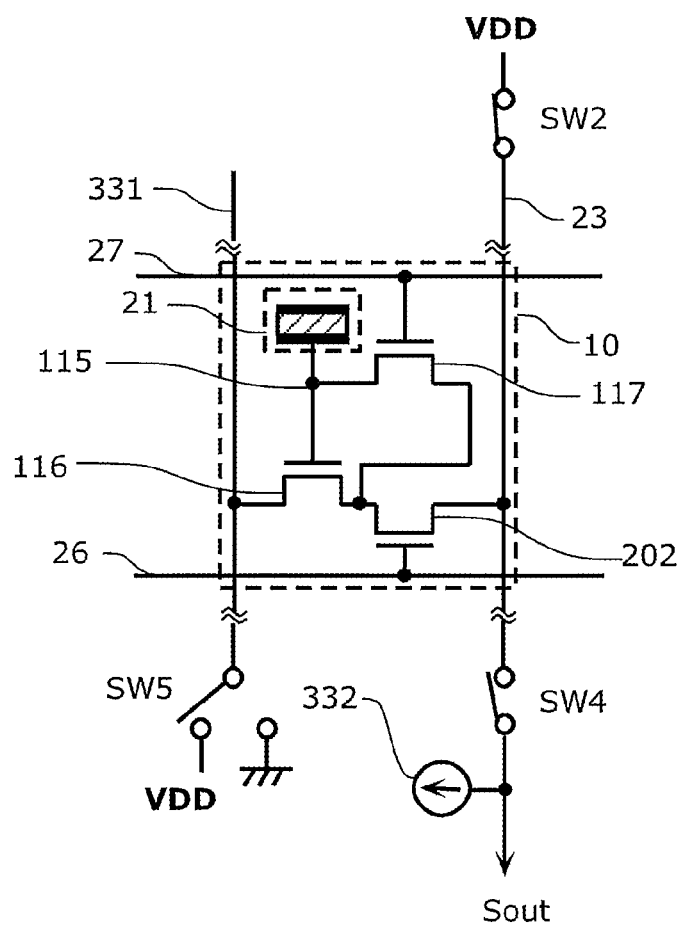
FIG. 8 is a circuit diagram of a pixel portion of a solid-state imaging device according to an embodiment 4.

FIG. 8 is a circuit diagram of a pixel portion of the solid-state imaging device according to the embodiment 4. Specifically, the figure illustrates an example of a circuit of a pixel 10 belonging to row m (m is a natural number) and column n (n is a natural number) of a pixel portion 12, and its peripheral circuit in the present embodiment. Description will be given, focusing on differences from the circuit of the pixel 10 and its peripheral circuit according to the embodiment 3. One end of the column signal line 23 is connected to a power voltage feeding circuit which feeds power potential VDD, via the switch SW2. The reset transistor 117 has a source and a drain one of which is connected to the gate terminal of the amplifier transistor 116. The other of the source and the drain of the reset transistor 117 is connected to one of a source and a drain of the amplifier transistor 116.

Figure 9:
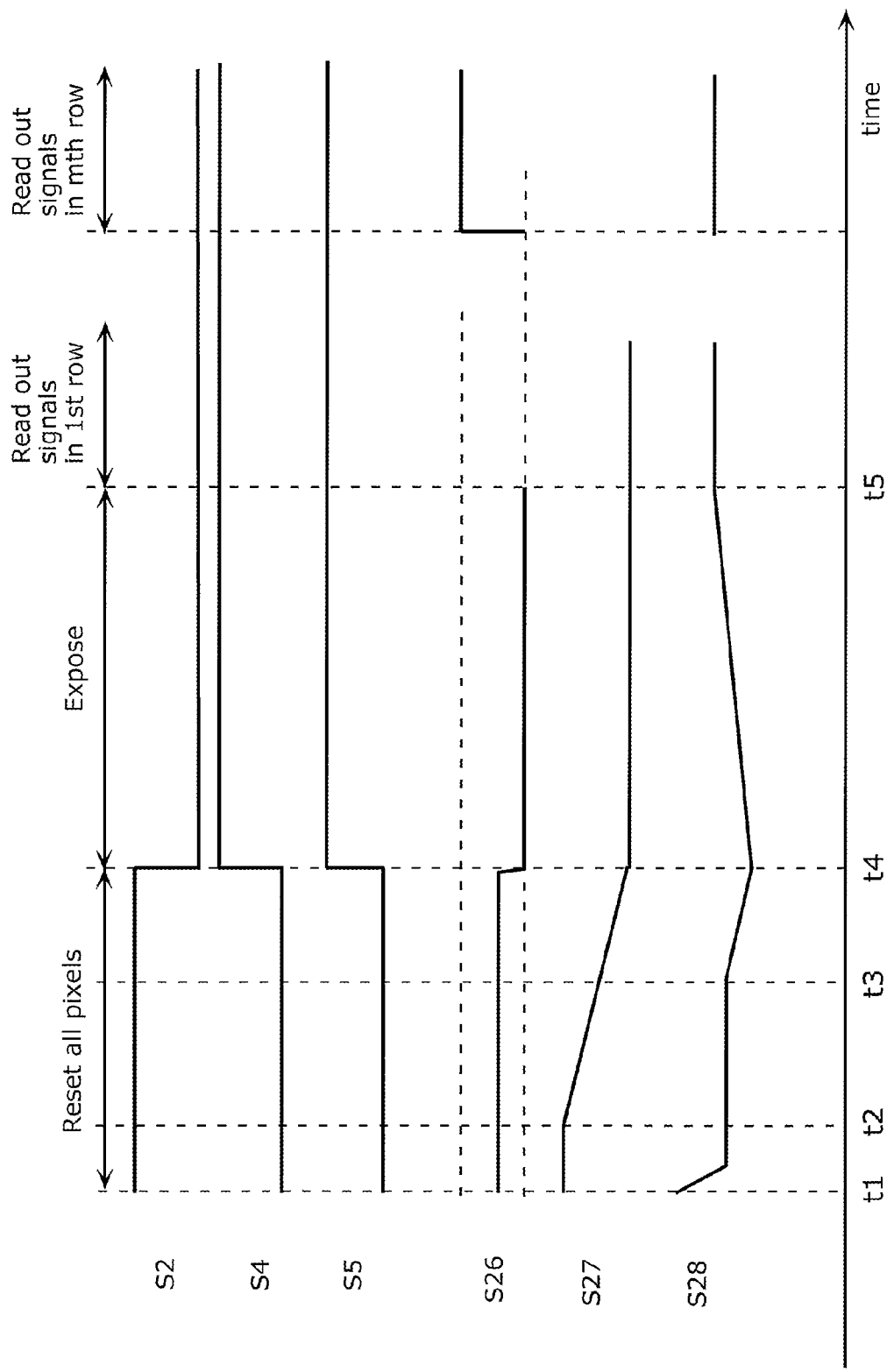
FIG. 9 is a timing diagram showing a method for driving the solid-state imaging device according to the embodiment 4.

FIG. 9 is a timing diagram showing a method for driving the solid-state imaging device according to the embodiment 4. Specifically, the figure is a timing diagram showing a method for driving pixels in the row m, including the pixel 10 shown in FIG. 8, and its peripheral circuit.

At a time t1, a reset of the FD portion 115 is initiated. A difference, herein, of the present embodiment from the embodiments 1 to 3 is that the reset is initiated for all pixels in the time t1. At this time, the control signal S4 is low, and thus a switch SW4 is non-conductive. The control signal S2 is high, and thus the switch SW2 is conductive. The control signal S5 is low, and thus a power/ground potential feeding line 331 is connected to a ground potential feeding circuit. The control signal S27 is high, and thus the reset transistor 117 is conductive. The control signal S26 has electric potential intermediate between high and low, and thus the selection transistor 202 acts as a load on the amplifier transistor 116. The gate terminal and the one of the source and the drain of the amplifier transistor 116 are shorted via the reset transistor 117. Electric potential of the one of the source and the drain of the amplifier transistor 116 is thus uniquely determined depending on the selection transistor 202 that acts as the load. At this time, electric potential of the column signal line 23 remains VDD.

At a time t2, the control signal S27 starts gradually dropping down from high. The control signal S27 is slowly and continuously changed so as to have a tapering shape. The bandwidth of the kTC noise generated in the reset transistor 117 is inversely proportional to the channel resistance of the reset transistor 117. Hence, the cascode amplifier formed of two transistors, the amplifier transistor 116 and the selection transistor 202, accommodates the bandwidth of the kTC noise generated in the reset transistor 117, thereby achieving a high reduction in noise.

At a time t3, electric potential S28 of the source of the amplifier transistor 116 starts dropping further. This is because the reset transistor 117 turns off, and the electric potential S28 falls to respond to the gate voltage of the reset transistor 117, due to coupling capacitance of the gate terminal of the reset transistor 117 and the FD portion 115.

At a time t4, after the reset of all the pixels of the FD portion 115 is completed, simultaneous exposure of all the pixels is initiated. In other words, what is known as global reset is achieved.

At a time t5, a pixel signal dependent on the quantity of signal charge generated by the photoelectric conversion unit 21 is output via the column signal line 23. A difference herein from the reset in the time t1 is that signals are sequentially read out row by row. A control signal S4 is high, and thus a switch SW4 is conductive. A control signal S2 is low, and thus a switch SW2 is non-conductive. The control signal S5 is high, and thus the one end of the power/ground potential feeding line 331 is connected to the power potential feeding circuit. Meanwhile, a control signal S26 is high, and thus a selection transistor 202 is conductive. A control signal S27 is low, and thus a reset transistor 117 is non-conductive. At this time, electric potential S23 of the column signal line 23 represents the pixel signal dependent on the quantity of the signal charge generated by the photoelectric conversion unit 21.

As described above, in the solid-state imaging device according to the embodiment 3, electric potential intermediate between high and low is applied to a gate terminal of the selection transistor 202 in resetting the FD portion 115, thereby forming a noise reduction circuit solely by the unit pixel. Thus, the kTC noise is reduced even if the unit pixel includes three transistors.

Embodiment 5

A solid-state imaging device according to an embodiment 5 and a method for driving the same will be described. It should be noted that the same reference signs as those used in the embodiments 1 to 4 will be used herein to refer to substantially the same components, and the description of the components may be omitted. The overall configuration and sectional view of the solid-state imaging device according to the embodiment 5 are substantially the same as those of the solid-state imaging device according to the embodiment 1, and thus will be omitted.

Figure 10:
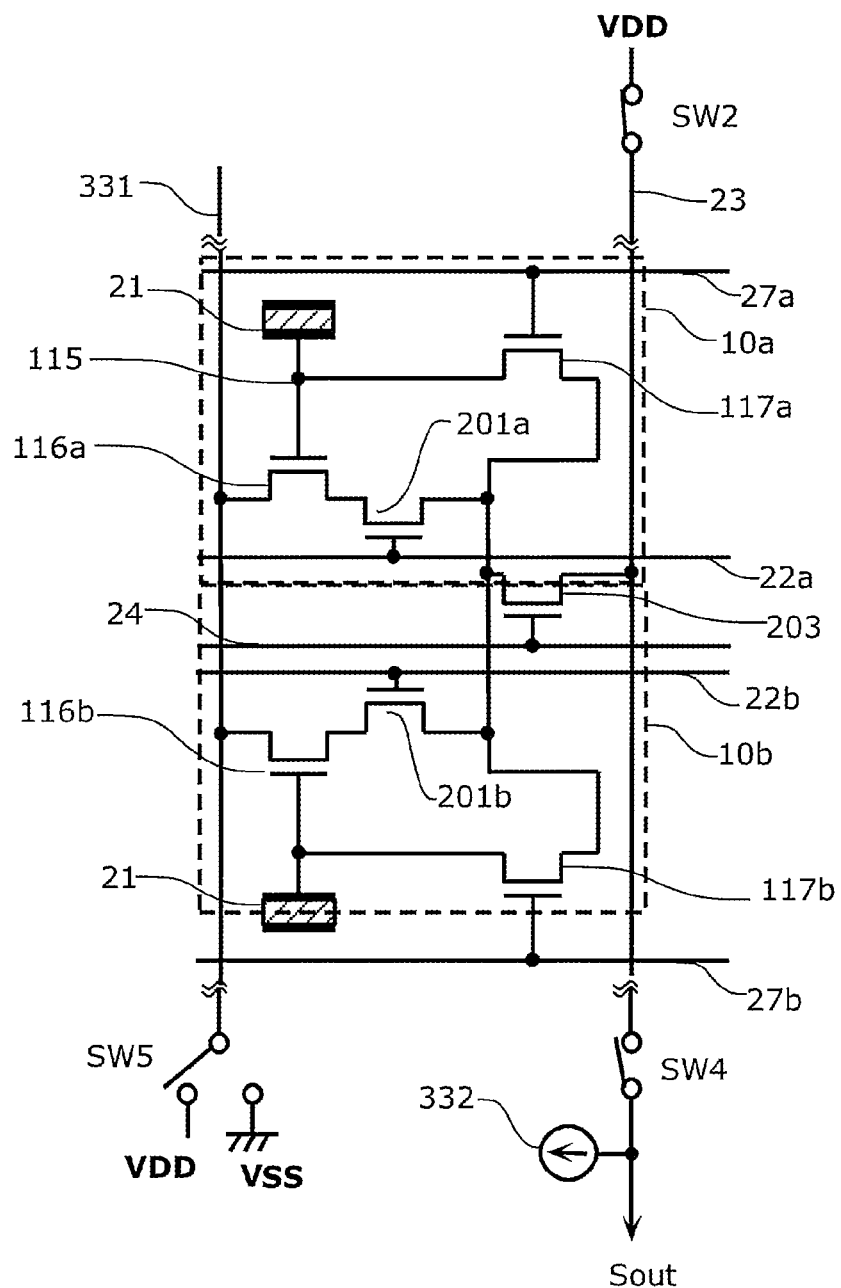
FIG. 10 is a circuit diagram of a pixel portion of a solid-state imaging device according to an embodiment 5.

FIG. 10 is a circuit diagram of a pixel portion of the solid-state imaging device according to the embodiment 5. Specifically, the figure illustrates an example of circuits of a pixel 10a belonging to row m (m is a natural number) and column n (n is a natural number) and a pixel 10b belonging to row (m+1) (m is a natural number) and the column n (n is a natural number) of the pixel portion 12, and its peripheral circuit in the present embodiment. Voltages dependent on signal charges of the pixels 10a and 10b are output to the column signal line 23 via a load transistor 203. Specifically, the load transistor 203 has a source and a drain one of which is connected to one of a source and a drain of a selection transistor 201a of the pixel 10a and one of a source and a drain of a selection transistor 201b of the pixel 10b adjacent to the pixel 10a. The other of the source and the drain of the load transistor 203 is connected to the column signal line 23 which is a first column signal line included in a plurality of column signal lines.

While in FIG. 10, the load transistor 203 is connected commonly to the pixels 10a and 10b adjacent to each other in the column direction, the load transistor 203 may be commonly connected to a plurality of pixels adjacent to one another in the row and column directions.

The method for driving the solid-state imaging device according to the embodiment 5 will be described below, with reference to FIG. 11.

Figure 11:
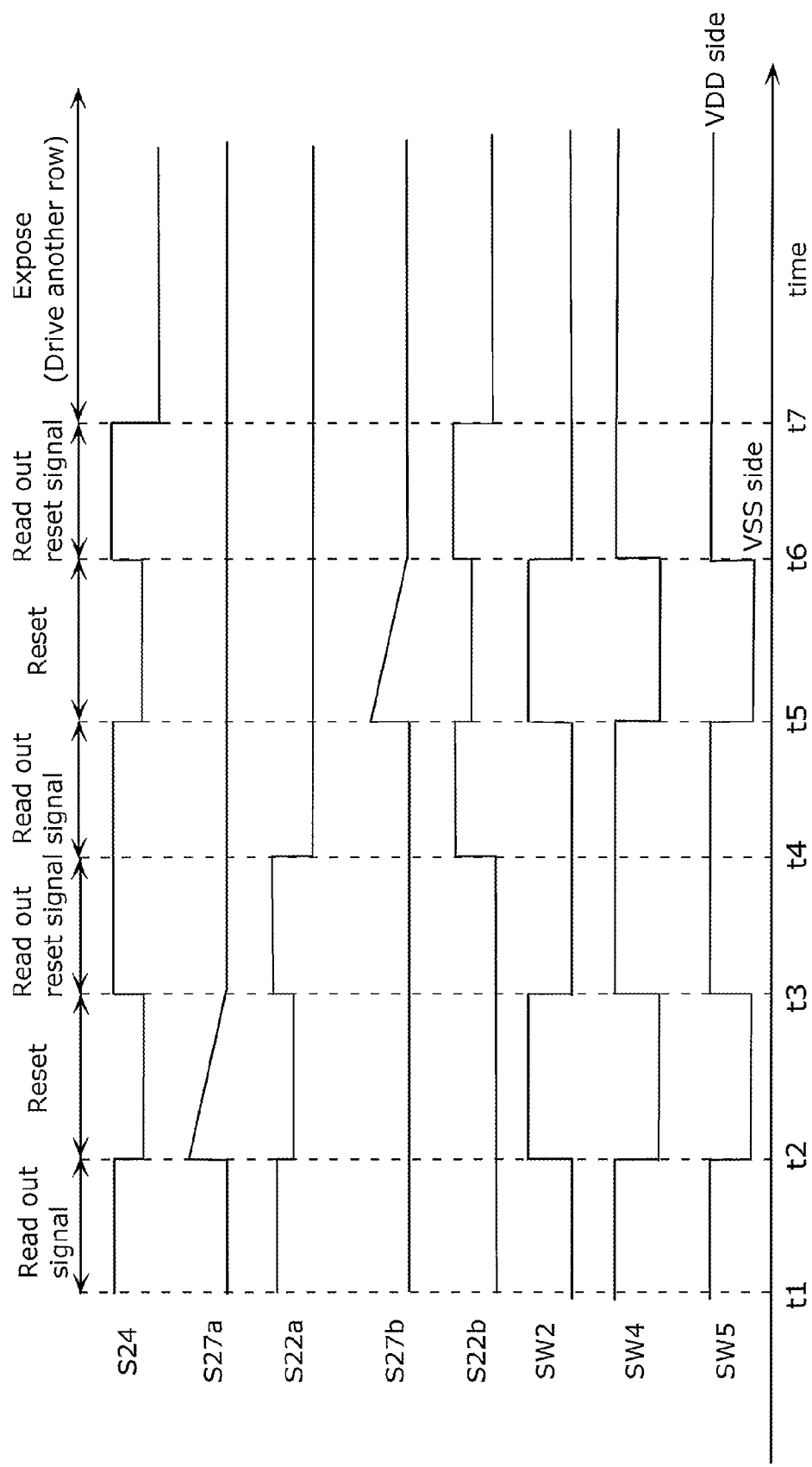
FIG. 11 is a timing diagram showing a method for driving the solid-state imaging device according to the embodiment 5.

FIG. 11 is a timing diagram showing the method for driving the solid-state imaging device according to the embodiment 5.

First, the pixel 10a is driven in times t1, t2, t3, and t4. The pixel 10 is scanned vertically from top to bottom in FIG. 10.

In the time t1, a control unit turns a control signal S24 of the load transistor 203 on, a control signal S27a of a reset transistor 117a off, and a control signal S22a of the selection transistor 201a on. Meanwhile, control signals S27b and S22b relevant to the pixel 10b are turned off. Moreover, the control unit turns a switch SW2 off, a switch SW4 on, and connects a switch SW5 to a power potential feeding circuit. This allows a voltage dependent on signal charge obtained from the exposure of the pixel 10a to be read out through SOUT of an amplifier transistor 116a.

Next, in the time t2, the control unit sets the control signal S24 to have electric potential which is intermediate between high and low, turns the control signal S27a on, and sets the control signal S22a to have electric potential intermediate between high and low. Moreover, the control unit turns the switch SW2 on, the switch SW4 off, and connects the switch SW5 to a ground potential feeding circuit. The control unit sets the control signal S24 to have the intermediate electric potential to drive the load transistor 203 as a resistor. Additionally, the control unit sets the control signal S22a to have the intermediate electric potential as well to cause the amplifier transistor 116a and the selection transistor 201a to act as a cascode amplifier having the load transistor 203 as a load. An input terminal of the cascode amplifier is a node point between the FD portion 115 and a gate of the amplifier transistor 116a. An output terminal of the cascode amplifier is a node point between the selection transistor 201a and the reset transistor 117a. The output is input to the FD portion 115 via the reset transistor 117a, that is, fed back to the gate of the amplifier transistor 116a, which resets the pixel 10a. The control signal S27a is turned off gradually, thereby gradually narrowing the band of the feedback loop. The kTC noise is reduced when the band of the feedback loop is made narrower than the band of the kTC noise.

Next, in the time t3, the control unit turns the control signal S24 on, the control signal S27a off, the control signal S22a on, the switch SW2 off, the switch SW4 on, and connects the switch SW5 to the power potential feeding circuit. This introduces the same state as in the time t1. Thus, a voltage dependent on a reset voltage for the pixel 10a can be read out from the amplifier transistor 116a through SOUT.

In times t4 through t7, the pixel 10b which includes an amplifier transistor 116b, a reset transistor 117b, and the selection transistor 201b is driven in the same manner as the pixel 10a is driven, and thus the description will not be repeated. Subsequently, pixels disposed in another other row are driven in the same manner.

Embodiment 6

A solid-state imaging device according to an embodiment 6 and a method for driving the same will be described. It should be noted that the same reference signs as those used in the embodiments 1 to 5 will be used herein to refer to substantially the same components and the description of the components may be omitted. The overall configuration and sectional view of the solid-state imaging device according to the embodiment 6 are substantially the same as those of the solid-state imaging device according to the embodiment 1, and thus will be omitted.

Figure 12:
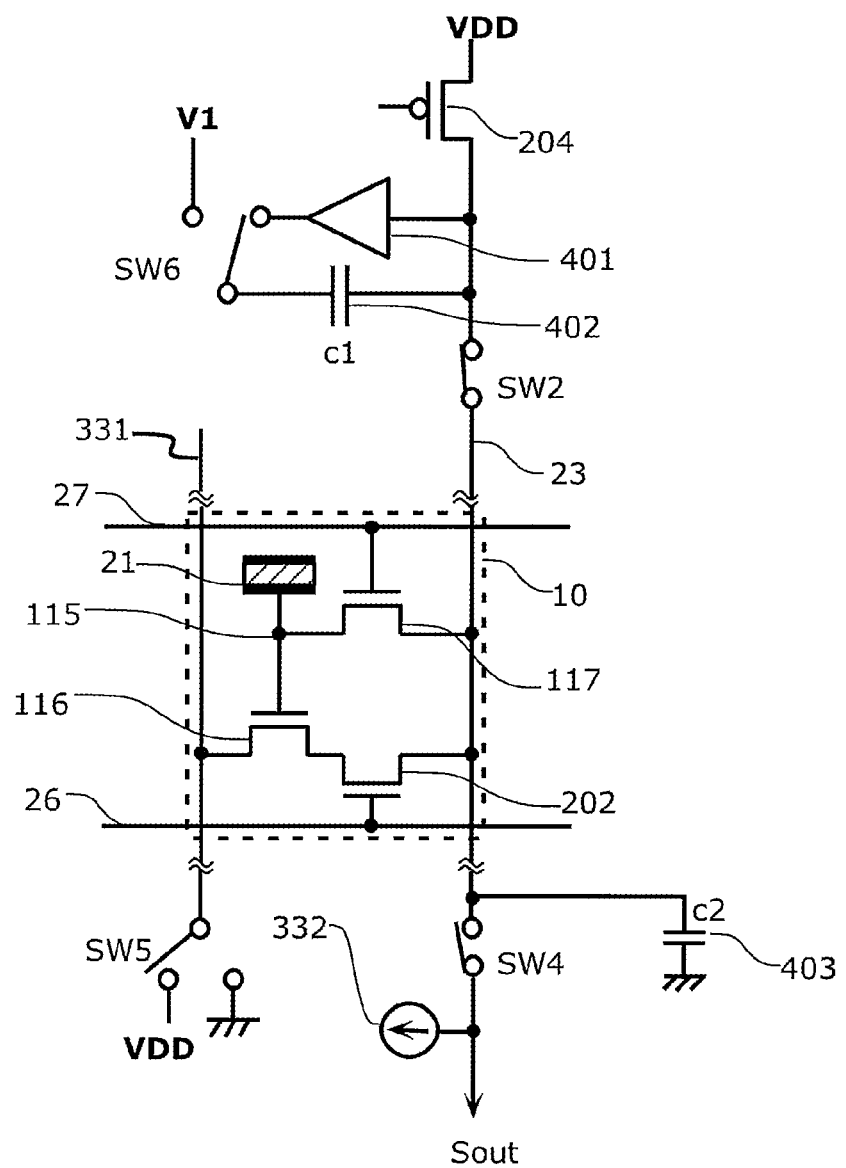
FIG. 12 is a circuit diagram of a pixel portion of a solid-state imaging device according to an embodiment 6.

FIG. 12 is a circuit diagram of a pixel portion of the solid-state imaging device according to the embodiment 6. Specifically, the figure illustrates an example of a circuit of a pixel 10 belonging to row m (m is a natural number) and column n (n is a natural number) of a pixel portion 12, and its peripheral circuit in the present embodiment.

In addition to the components included in the solid-state imaging device according to the embodiment 1, the solid-state imaging device according to the present embodiment further includes an auxiliary amplifier circuit 401 which is an amplifier having an input terminal connected to a column signal line 23 which is a first column signal line included in a plurality of column signal lines, and an auxiliary feedback capacitor 402. The auxiliary amplifier circuit 401 and the auxiliary feedback capacitor 402 are connected to one of a source and a drain of a load transistor 204. An output terminal of the auxiliary amplifier circuit 401 is connected, via a switch SW6, to the auxiliary feedback capacitor 402 or a constant voltage source which feeds a constant voltage V1. The column signal line 23 is connected to ground potential via a parasitic capacitance 403. The parasitic capacitance 403 is described in the embodiment 6 for the sake of clarity, while the parasitic capacitance 403 is present in the embodiments 1 through 5 as well.

The method for driving the solid-state imaging device according to the embodiment 6 will be described below, with reference to FIG. 13.

Figure 13:
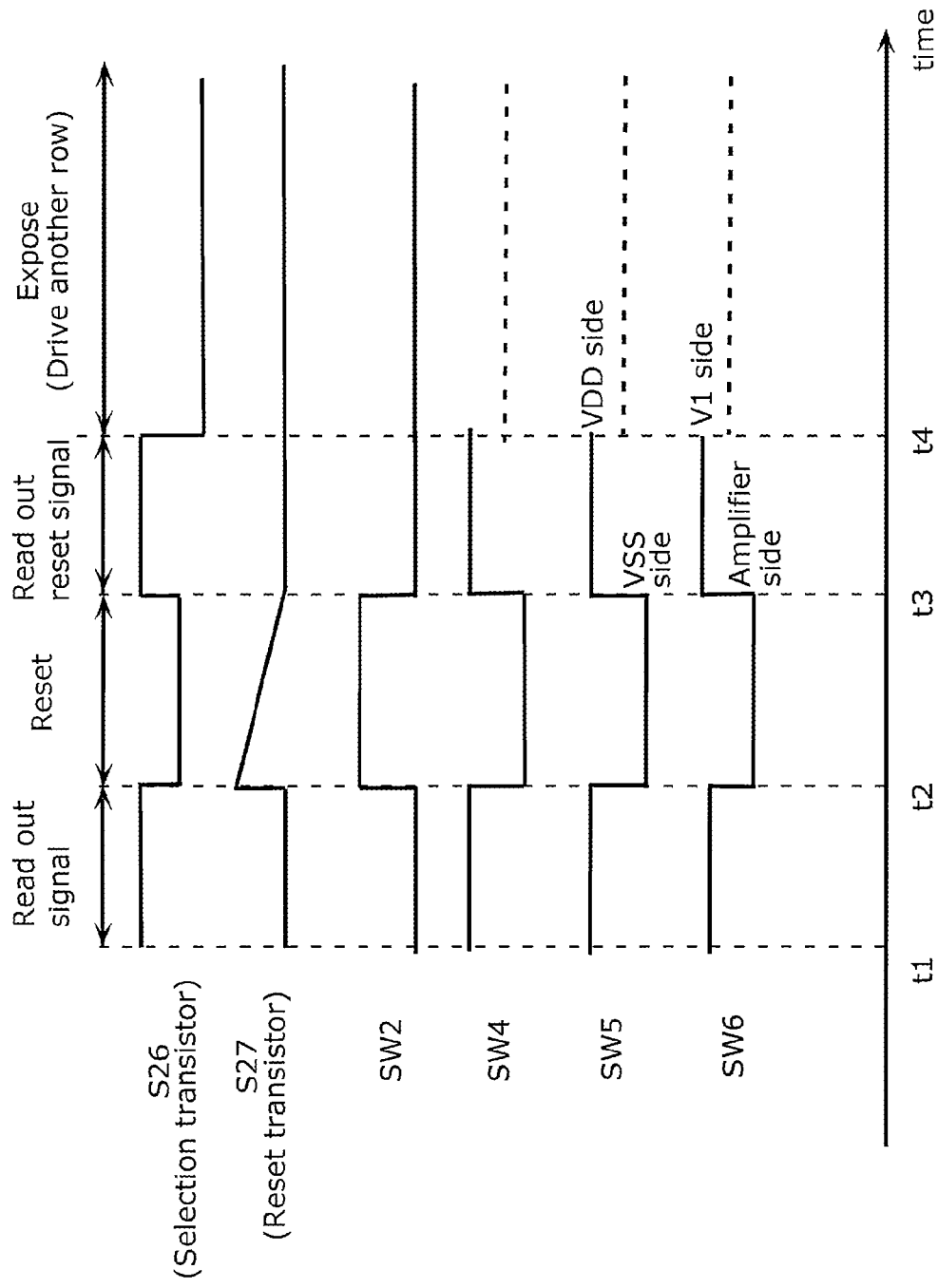
FIG. 13 is a timing diagram showing a method for driving the solid-state imaging device according to the embodiment 6.
Figure 14:
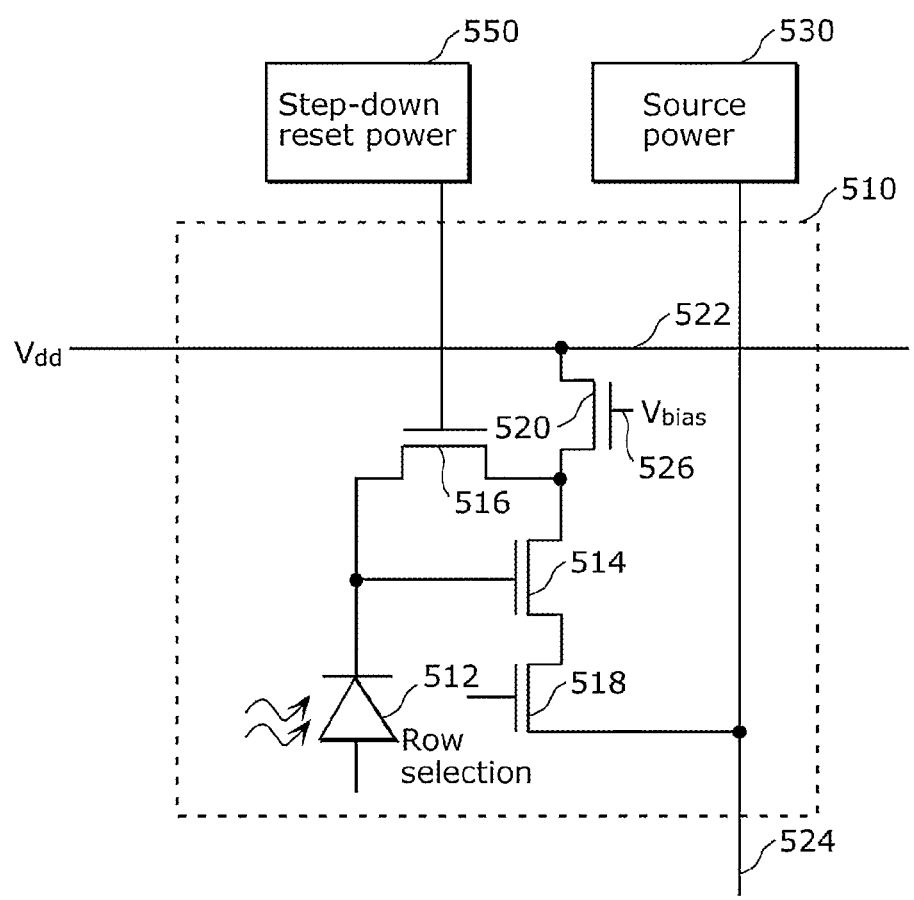
FIG. 14 is a diagram showing a unit pixel disclosed in PTL 2 and its peripheral circuit.

FIG. 13 is a timing diagram showing the method for driving the solid-state imaging device according to the embodiment 6.

First, in a time t1, a control unit turns a control signal S26 of a selection transistor 202 on, a control signal S27 of a reset transistor 117 off, a switch SW2 off, a switch SW4 on, and connects a switch SW5 to a power potential feeding circuit, and the switch SW6 to the constant voltage source. This outputs, to SOUT via an amplifier transistor 116, a voltage dependent on signal charge obtained by exposure of the pixel 10.

Next, in a time t2, the control unit sets the control signal S26 to have electric potential which is intermediate between high and low, turns the control signal S27 on, the switch SW2 on, and the switch SW4 off, and connects the switch SW5 to a ground potential feeding circuit, and the switch SW6 to the auxiliary amplifier circuit 401. Turning the control signal S27 gradually off reduces the kTC noise, as with the embodiments 1 to 5. However, if transconductance of the amplifier transistor 116 is small, the parasitic capacitance 403 cannot be driven sufficiently, which ends up requiring a significantly long time to reduce the kTC noise. This drawback can be overcome by employing the auxiliary amplifier circuit 401 and the auxiliary feedback capacitor 402 according to the following Equation 1, $$C1(B-1)=C2 \quad \text{(Equation 1)}$$

where B represents voltage gain of the auxiliary amplifier circuit 401, C1 represents a capacitance value of the auxiliary feedback capacitor 402, and C2 represents a capacitance value of the parasitic capacitance 403. Setting values of C1 and B such that the right side of Equation 1 is slightly smaller than the left side effectively decreases the parasitic capacitance value C2, thereby reducing the time taken to reduce the kTC noise. If the left side of Equation 1 is greater than the right side, oscillation results in the vicinity of the pixel.

The switch SW6 is connected to the auxiliary amplifier circuit 401 during the reset periods which are the times t2 and t3, and is connected to the constant voltage source during the other periods. This allows the auxiliary amplifier circuit 401 and the column signal line 23 to be disconnected from each other during the periods other than the reset periods which are the times t2 and t3.

Steps performed in the time t3 and thereafter are the same as those in the other embodiments, and thus the description will be omitted.

While the solid-state imaging device according to the present invention has been described, with reference to the embodiments 1 to 6, the present invention is not limited to the above embodiments. Various modifications to the embodiments that may be conceived by those skilled in the art are included in the scope of the present invention, without departing from the essence of the present invention. Moreover, the components in the plurality of embodiments may be combined arbitrary, without departing from the spirit of the present invention.

Moreover, the processing components included in the solid-state imaging device according to the above embodiments are each implemented typically in an LSI (Large Scale Integration) which is an integrated circuit. These processing components may separately be mounted on one chip, or some or the whole of the processing components may be mounted on one chip.

Moreover, the integrated circuit is not limited to the LSI and may be implemented in a dedicated circuit or a general-purpose processor. A field programmable gate array (FPGA) which is programmable after manufacturing the LSI, or a reconfigurable processor in which connection or settings of circuit cells in LSI is reconfigurable may be used.

Moreover, while corners and sides of each component are depicted in a linear manner in the cross-sectional views and so on for manufacturing reasons, the components that have rounded corners and rounded lines are also included in the present invention.

Moreover, at least some of the functionality of the solid-state imaging device according to the embodiments described above may be combined.

Moreover, numerals used in the above are merely illustrative for specifically describing the present invention and the present invention is not limited thereto.

Moreover, while the above description has been given with reference to the MOS transistors, any other transistors may be employed.

Furthermore, various modifications to the embodiments that may be conceived by those skilled in the art are included within the scope of the present invention, without departing from the spirit of the present invention.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

A solid-state imaging device according to the present invention is applicable to digital still cameras, medical cameras, surveillance cameras, digital single-lens reflex cameras, mirrorless digital single-lens cameras, for example.

The invention claimed is:

1. A solid-state imaging device comprising:
  a semiconductor substrate;
  a pixel portion which includes pixels in rows and columns above the semiconductor substrate; and
  a plurality of column signal lines provided for each of the columns of the pixel portion,
  the pixels each including:
  a photoelectric converting film;
  a pixel electrode disposed along a surface of the photoelectric converting film, the surface facing the semiconductor substrate;
  a transparent electrode disposed along a surface of the photoelectric converting film opposite the surface along which the pixel electrode is disposed;
  a charge storage portion electrically connected to the pixel electrode, the charge storage portion storing signal charge from the photoelectric converting film;
  an amplifier transistor which outputs a pixel signal dependent on quantity of the signal charge in the charge storage portion;

a reset transistor which resets electric potential of the charge storage portion; and a selection transistor which determines a timing at which the amplifier transistor is to output the pixel signal, the solid-state imaging device further comprising a control unit configured to apply to a gate terminal of the selection transistor a first voltage which places the selection transistor in a conductive state and apply to a gate terminal of the reset transistor a second voltage which places the reset transistor in a non-conductive state in a first time period where the pixel signal dependent on the quantity of the signal charge in the photoelectric converting film is read out, and apply to the gate terminal of the selection transistor a third voltage which is an intermediate value between the first voltage and the second voltage in a second time period where the charge storage portion is reset.

2. The solid-state imaging device according to claim 1, wherein the control unit is configured to apply to the gate terminal of the reset transistor a voltage which continuously changes from the first voltage to the second voltage in the second time period.

3. The solid-state imaging device according to claim 1, wherein one of a source and a drain of the amplifier transistor is connected to a power potential feeding line, and the control unit is configured to feed a power voltage to the power potential feeding line in the first time period and feed a ground voltage to the power potential feeding line in the second time period.

4. The solid-state imaging device according to claim 1, further comprising:

a load transistor having a source and a drain one of which is connected to a first column signal line included in the plurality of column signal lines via a switch;

an amplifier connected to the one of the source and the drain of the load transistor; and a capacitor connected to the amplifier, wherein an output of the amplifier is connected via the capacitor to a gate terminal of the amplifier transistor.

5. The solid-state imaging device according to claim 3, wherein one end of the power potential feeding line is connected to a source of the power voltage via a first switch, the other end of the power potential feeding line is connected to a source of the ground voltage via a second switch, the first switch is in the conductive state and the second switch is in the non-conductive state in the first time period, and the first switch is in the non-conductive state and the second switch is in the conductive state in the second time period.

6. The solid-state imaging device according to claim 3, wherein one end of the power potential feeding line is selectively connected to a source of the power voltage or a source of the ground voltage, the one end of the power potential feeding line is connected to the source of the power voltage in the first time period, and the one end of the power potential feeding line is connected to the source of the ground voltage in the second time period.

7. The solid-state imaging device according to claim 1, wherein one of a source and a drain of the reset transistor is connected to a gate terminal of the amplifier transistor, and the other of the source and the drain of the reset transistor is connected to one of a source and a drain of the amplifier transistor.

8. The solid-state imaging device according to claim 1, further comprising a load transistor, wherein one of a source and a drain of the load transistor is connected to one of a source and a drain of the selection transistor, and the other of the source and the drain of the load transistor is connected to a first column signal line included in the plurality of column signal lines.

9. The solid-state imaging device according to claim 8, wherein the one of the source and the drain of the load transistor is connected to the one of the source and the drain of the selection transistor of an adjacent pixel.

10. The solid-state imaging device according to claim 1 further comprising an amplifier having an input terminal connected to a first column signal line included in the plurality of column signal lines, wherein the amplifier has an output terminal connected to a constant voltage source via a switch.

11. The solid-state imaging device according to claim 1, wherein the pixels are disposed between the photoelectric converting film and the substrate.

* * * * *